United States Patent
Ishida

(10) Patent No.: US 7,638,997 B2
(45) Date of Patent: Dec. 29, 2009

(54) PHASE MEASUREMENT APPARATUS

(75) Inventor: Masahiro Ishida, Tokyo (JP)

(73) Assignee: Advantest Corporation (JP)

( * ) Notice: Subject to any disclaimer, the term of this patent is extended or adjusted under 35 U.S.C. 154(b) by 177 days.

(21) Appl. No.: 11/758,676

(22) Filed: Jun. 6, 2007

(65) Prior Publication Data

US 2008/0303509 A1 Dec. 11, 2008

(51) Int. Cl.
*G01R 25/00* (2006.01)
(52) U.S. Cl. .................... 324/76.77; 324/622
(58) Field of Classification Search .............. 324/76.77, 324/622
See application file for complete search history.

(56) References Cited

U.S. PATENT DOCUMENTS 7,127,018 B2 10/2006 Yamaguchi et al.
2006/0067390 A1* 3/2006 Tek et al. ................ 375/224
2008/0247451 A1* 10/2008 Yamaguchi ............. 375/226

OTHER PUBLICATIONS

"Jitter Analysis Clock Solutions" by Wavecrest Corporation, A Technologies Company, 1998. www.wavecrestcorp.com.
Article Titled "Analysis and Measurement Procedures Second Edition" jointly authored by J.S. Bendat and A.G. Piersol, in Random Data, by John Wiley & Sons, Inc., 1986 (p. 362).

* cited by examiner

*Primary Examiner*—Vincent Q Nguyen
(74) *Attorney, Agent, or Firm*—Chen Yoshimura LLP

(57) ABSTRACT

There is provided a phase measurement apparatus for measuring a phase of a signal under measurement. The phase measurement apparatus includes a sampling section that samples the signal under measurement at timings indicated by a sampling clock supplied thereto, a jitter injecting section that injects jitter to at least one of the signal under measurement which is to be input into the sampling section and the sampling clock, and a phase calculating section that calculates the phase of the signal under measurement based on a result of the sampling performed by the sampling section.

12 Claims, 12 Drawing Sheets

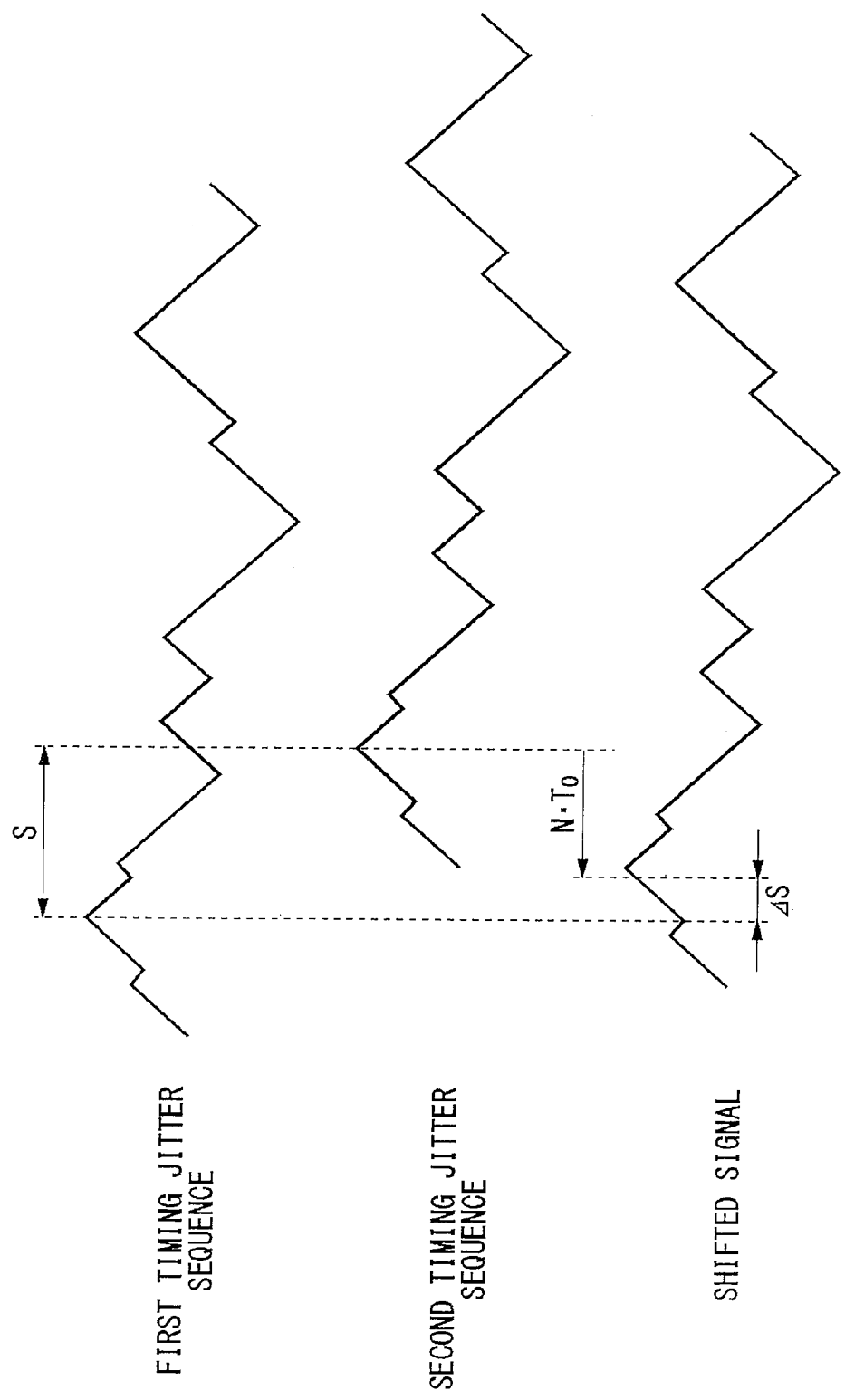

PHASE MEASUREMENT APPARATUS

BACKGROUND

1. Technical Field

The present invention relates to a phase measurement apparatus, a skew measurement apparatus, a phase measurement method and a skew measurement method. More particularly, the present invention relates to a phase measurement apparatus which samples a signal under measurement at predetermined periods, and uses the result of the sampling to calculate the phase of the signal under measurement.

2. Related Art

A skew between a plurality of signals may be statistically measured by using a device such as a time interval analyzer and a frequency counter. For example, a method is known which uses a time interval analyzer to measure a difference in timing between the zero-crossing points of the signals under measurement, and measure a skew based on the distribution of the measured difference in timing, as disclosed in "Jitter Analysis Clock Solutions", Wavecrest Corp., 1998, for example.

Another method is proposed which calculates instantaneous phases of the signals under measurement based on the analytic signals of the signals under measurement, and calculates a skew based on a differences in initial phase between the instantaneous phases as disclosed in U.S. Pat. No. 7,127,018.

However, the method performed with the use of a device such as a time interval analyzer has the following problem. After the timing of a particular zero-crossing point is measured, a dead time during which no measurement can be performed is present before the timing of a zero-crossing point is subsequently measured. For this reason, a long time period may be required to gather a sufficient number of samples of data to achieve desirable measurement accuracy.

On the other hand, the method based on the analytic signals also has a drawback. The analytic signals are calculated based on the result of sampling the signals under measurement. Here, to accurately calculate the analytic signals, it is preferable to use an A/D converter that has a resolution of approximately 8 bits in the amplitude axis or to set the sampling period at a sufficiently small value. To detect the logical values of the signals under measurement, however, the measuring pins of a semiconductor test apparatus (automatic test equipment, ATE) or the like use a 1-bit comparator to sample the signals under measurement at the rate of up to 6.5 GHz. This configuration makes it difficult to measure a skew highly accurately with a resolution of approximately 1 ps.

SUMMARY

In view of the above, an advantage of some embodiments of the present invention is to provide a phase measurement apparatus, a skew measurement apparatus, a phase measurement method and a skew measurement method which can solve the above-mentioned problems. This advantage is achieved by combining the features recited in the independent claims. The dependent claims define further effective specific example of the present invention.

To solve the above-mentioned problems, a first embodiment of the present invention provides a phase measurement apparatus for measuring a phase of a signal under measurement. The phase measurement apparatus includes a sampling section that samples the signal under measurement at timings indicated by a sampling clock supplied thereto, a jitter injecting section that injects jitter to at least one of the signal under measurement which is input into the sampling section and the sampling clock, and a phase calculating section that calculates the phase of the signal under measurement based on a result of the sampling performed by the sampling section.

A second embodiment of the present invention provides a skew measurement apparatus for measuring a skew between a first signal under measurement and a second signal under measurement which have substantially the same period. The skew measurement apparatus includes a first sampling section and a second sampling section that respectively sample the first and second signals under measurement at timings indicated by sampling clocks supplied thereto, a jitter injecting section that injects jitter to at least one of the first signal under measurement which is input into the first sampling section and the corresponding sampling clock, and to at least one of the second signal under measurement which is input into the second sampling section and the corresponding sampling clock, and a skew calculating section that calculates the skew between the first and second signals under measurement, based on results of the samplings performed by the first and second sampling sections.

A third embodiment of the present invention provides a phase measurement method for measuring a phase of a signal under measurement. The phase measurement method includes sampling the signal under measurement at timings indicated by a supplied sampling clock, injecting, in advance, jitter to at least one of the signal under measurement to be sampled and the sampling clock, and calculating the phase of the signal under measurement based on a result of the sampling.

A fourth embodiment of the present invention provides a skew measurement method for measuring a skew between a first signal under measurement and a second signal under measurement which have substantially the same period. The skew measurement method includes sampling the first and second signals under measurement at timings indicated by supplied sampling clocks, injecting, in advance, jitter to at least one of the first signal under measurement to be sampled and the corresponding sampling clock, and to at least one of the second signal under measurement to be sampled and the corresponding sampling clock, and calculating the skew between the first and second signals under measurement based on results of the samplings performed on the first and second signals under measurement.

Here, all the necessary features of the present invention are not listed in the summary. The sub-combinations of the features may become the invention.

BRIEF DESCRIPTION OF THE DRAWINGS

FIG. 14 shows, as an example, first and second timing jitter sequences of first and second signals under measurement.

DESCRIPTION OF EXEMPLARY EMBODIMENTS

Hereinafter, one aspect of the present invention will be described through some embodiments. The embodiments do not limit the invention according to the claims, and all the combinations of the features described in the embodiments are not necessarily essential to means provided by aspects of the invention.

Figure 1:
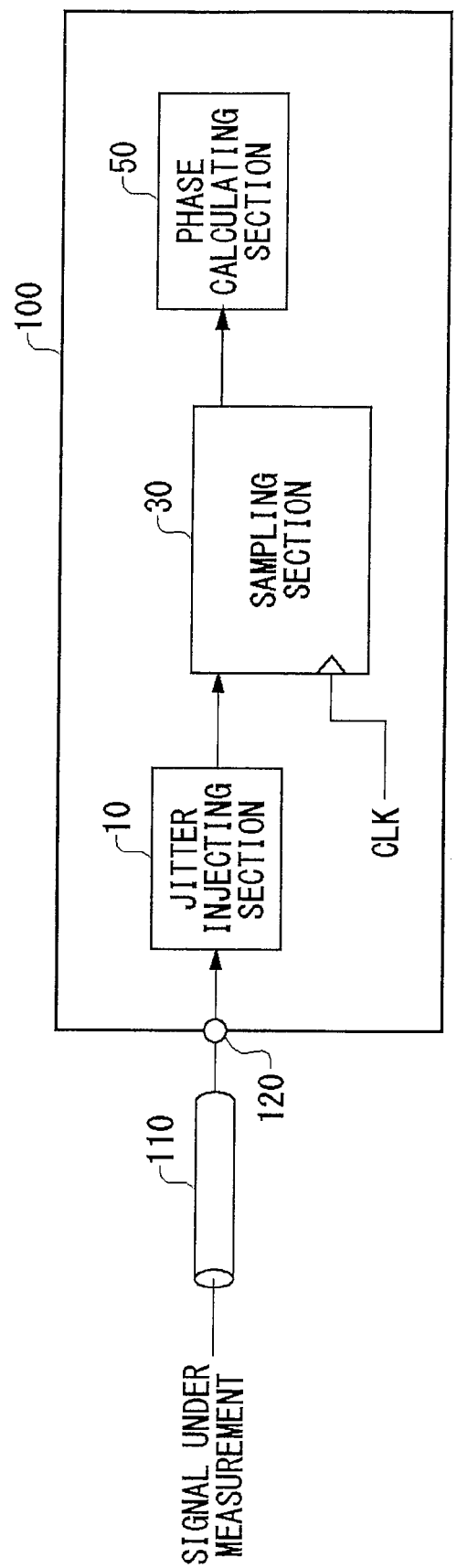
FIG. 1 shows an exemplary configuration of a phase measurement apparatus 100 relating to an embodiment of the present invention.

FIG. 1 shows an exemplary configuration of a phase measurement apparatus 100 relating to an embodiment of the present invention. The phase measurement apparatus 100 measures the phase of a signal under measurement supplied to an input terminal 120. The signal under measurement may be supplied to the input terminal 120 via a transmission path 110 such as a cable, for example. The signal under measurement may be a clock signal which has edges at substantially constant periods, or a data signal which has edges corresponding to a date pattern.

The phase measurement apparatus 100 includes therein a jitter injecting section 10, a sampling section 30, and a phase calculating section 50. The sampling section 30 samples the signal under measurement at timings indicated by a sampling clock supplied thereto. The sampling section 30 may be a circuit for outputting 1-bit data as a result of the sampling.

For example, the sampling section 30 may output, at the timing of each rising edge of the sampling clock supplied thereto, a binary logical value indicating whether the signal level of the signal under measurement is higher than a predetermined reference value at the timing of each rising edge of the sampling clock.

The sampling section 30 may include therein a level comparator and a flip-flop, for example. The level comparator outputs an H logic when the signal level of the signal under measurement is higher than the predetermined reference value, and outputs an L logic when the signal level is equal to or lower than the predetermined reference value. The flip-flop receives and outputs the output from the level comparator at the timings indicated by the sampling clock.

The jitter injecting section 10 injects predetermined jitter to at least one of the signal under measurement which is supplied to the input terminal 120 and the sampling clock. In other words, the jitter injecting section 10 creates a fluctuation corresponding to the predetermined jitter in a relative phase between the signal under measurement and sampling clock.

The following describes an exemplary case where the jitter injecting section 10 injects jitter to the signal under measurement. However, the jitter injecting section 10 may inject jitter to the sampling clock, or inject different types of jitter to the signal under measurement and the sampling clock. Here, injection of jitter to the signal under measurement may indicate modulation of the signal under measurement in the time axis in accordance with the jitter to be injected. For example, the jitter injecting section 10 may inject the jitter to the signal under measurement by using phase modulation, frequency modulation or the like.

The phase calculating section 50 calculates the phase of the signal under measurement based on the result of the sampling done by the sampling section 30. The technique used by the phase calculating section 50 to calculate the phase is described later with reference to FIGS. 2 to 9.

Figure 2:
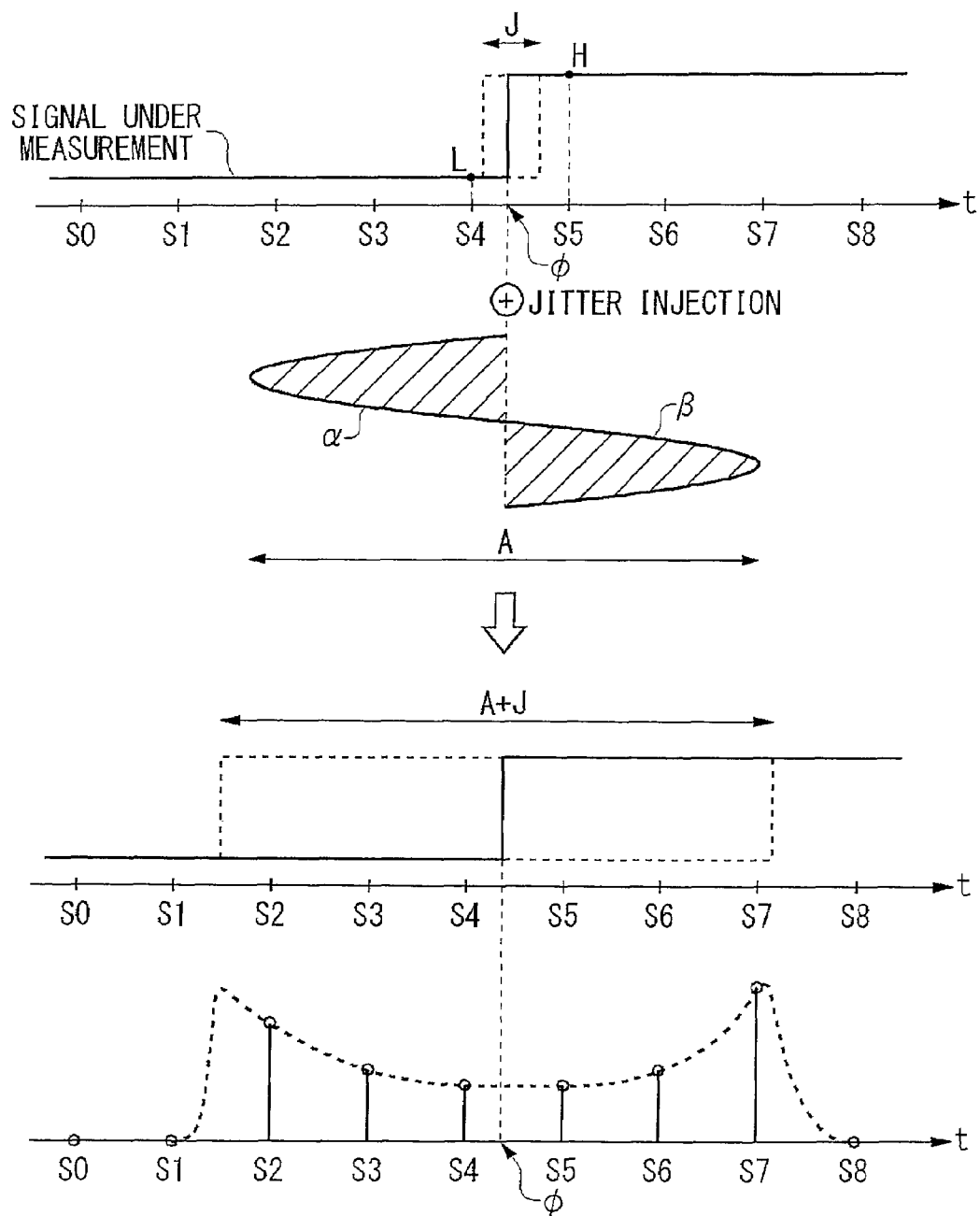
FIG. 2 shows an exemplary operation of the phase measurement apparatus 100.

FIG. 2 shows an exemplary operation of the phase measurement apparatus 100. As described above, the sampling section 30 samples the signal under measurement at the timings indicated by the sampling clock (S0, S1, S2, . . . ), and outputs the result of the sampling (L/H) at each timing. In the example shown in FIG. 2, the logical value transits between the timings S4 and S5, which indicates that the signal under measurement has an edge between the timings S4 and S5.

The phase calculating section 50 relating to the present embodiment detects the position of the edge of the signal under measurement, as the phase φ of the signal under measurement. Here, it should be noted that deterministic jitter J is injected to the signal under measurement at a signal generating circuit, the transmission path 110, and the like. Therefore, the phase calculating section 50 may calculate, as the phase φ of the signal under measurement, an average value of the positions of the edges of the individual cycles of the signal under measurement.

Here, the duration of each cycle of the signal under measurement (the period of the signal under measurement) may be supplied in advance to the phase calculating section 50 by a user or the like. The average value of the positions of the edges can be obtained based on the distribution of the timing of the sampling clock at which the transition of the logical value output from the sampling section 30 is detected.

For example, a case is assumed where the sampling is repeatedly performed for N cycles at the timings S0, S1, S2, . . . as shown in FIG. 2. In addition, it is assumed that the logical value output from the sampling section 30 shows the L logic at the timing S3 and transits to the H logic at the timing S4 in N/2 cycles. Similarly, it is assumed that the logical value output from the sampling section 30 shows the L logic at the timing S4 and transits to the H logic at the timing S5 in N/2 cycles. If this is the case, the phase calculating section 50 may calculate the timing S4 as the phase φ of the signal under measurement.

However, when the amplitude of the jitter J injected to the signal under measurement is smaller than the period of the sampling clock as shown in FIG. 2, for example, the transition of the logical value output from the sampling section 30 may be detected at the timing S5 in every cycle of the signal under measurement. In this case, it is not possible to calculate, as the average value of the positions of the edges of the signal under measurement, a position between the timings S4 and S5.

Here, the phase measurement apparatus 100 injects predetermined jitter to the signal under measurement shown in FIG. 2, so as to detect the position of the edge of the signal under measurement more accurately. For example, the jitter injecting section 10 may preferably inject jitter the amplitude A of which is larger than the period of the sampling clock (i.e. the interval between the adjacent ones of the timings S0, S1, S2, . . . ).

The jitter injecting section 10 may preferably inject sinusoidal jitter, random (Gaussian) jitter, or the like, whose mean value is substantially zero. For example, the jitter injecting section 10 may inject jitter in which jitter component distributions A and B for delaying and advancing the phase of the edge of the signal under measurement are substantially symmetrical to each other. As an alternative example, the jitter injecting section 10 may inject jitter in which jitter waveforms α and β of the components for delaying and advancing the phase of the edge of the signal under measurement are substantially symmetrical to each other. Furthermore, the jitter injecting section 10 may inject jitter in which the jitter waveforms α and β alternate with each other.

In this way, jitter which has an amplitude A+J is injected to the signal under measurement to be input into the sampling section 30. As mentioned above, the mean value of the jitter injected by the jitter injecting section 10 is substantially zero. Therefore, the mean value of the positions of the edges of the signal under measurement is not affected by the injected jitter.

The sampling section 30 samples the signal under measurement to which the jitter having the amplitude A+J has been injected. Since the amplitude A+J in the time axis is larger than the period of the sampling clock, the transition of the logical value can be detected at different timings of the sampling clock.

The phase calculating section 50 may detect the timing at which the logical value output from the sampling section 30 transits in each cycle of the signal under measurement. The phase calculating section 50 may calculate the distribution of the detected timings, and use the calculated distribution to calculate the phase of the signal under measurement.

For example, when the jitter injecting section 10 injects sinusoidal jitter, the distribution calculated by the phase calculating section 50 shows the lowest probability at the position of the edge of the signal under measurement, as shown in FIG. 2. The phase calculating section 50 may detect, as the position of the edge of the signal under measurement, the timing at which a curve obtained by approximating the calculated distribution shows the lowest probability.

As described above, the phase measurement apparatus 100 can accurately measure the phase of the signal under measurement. To be specific, when measuring the position of the edge of the signal under measurement, the phase measurement apparatus 100 can raise the resolution in the time axis so as to be better than the period of the sampling clock, by injecting jitter to the signal under measurement. Therefore, the phase measurement apparatus 100 can accurately measure the phase of the signal under measurement even with the use of the sampling section 30 which has a resolution of only 1 bit in the amplitude axis, for example.

Figure 3:
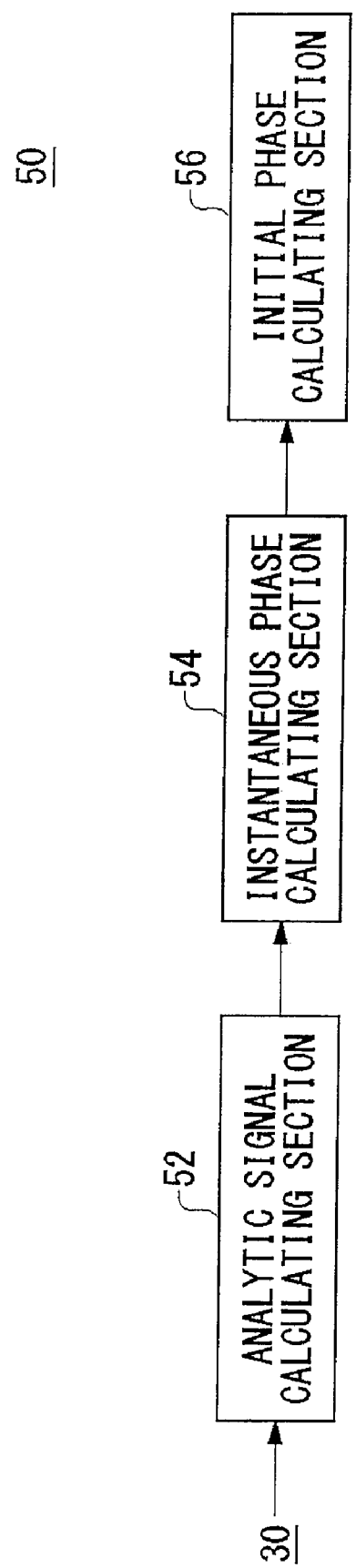
FIG. 3 shows an exemplary configuration of a phase calculating section 50.

FIG. 3 shows an exemplary configuration of the phase calculating section 50. The phase calculating section 50 relating to this example uses analytic signals. In this way, the phase calculating section 50 calculates the phase of the signal under measurement without the need of calculating the distribution described with reference to FIG. 2.

The phase calculating section 50 includes therein an analytic signal calculating section 52, an instantaneous phase calculating section 54, and an initial phase calculating section 56. The analytic signal calculating section 52 calculates an analytic signal of the signal under measurement based on the result of the sampling performed by the sampling section 30.

Figure 4:
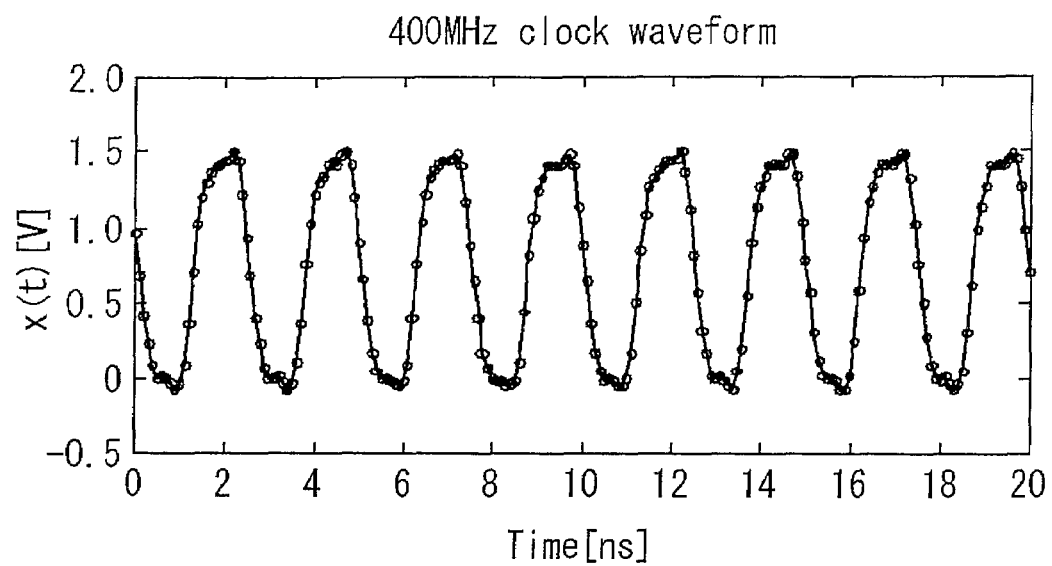
FIG. 4 shows, as an example, the result of sampling performed by a sampling section 30.

FIG. 4 shows, as an example, the result of the sampling performed by the sampling section 30. The analytic signal calculating section 52 may calculate a complex spectrum by performing Fourier transform on the sampling result.

Figure 5:
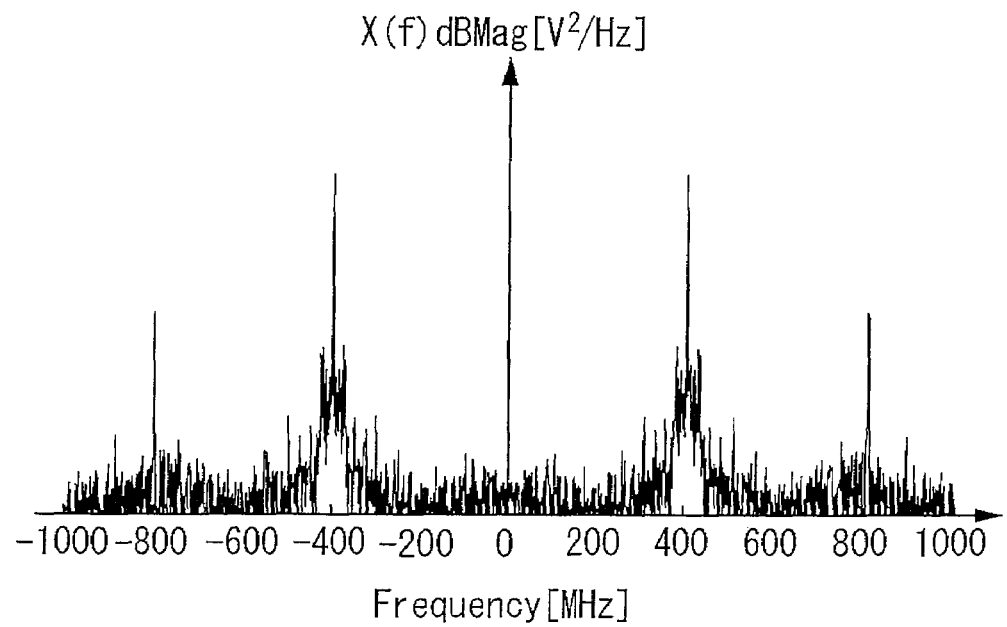
FIG. 5 shows, as an example, a complex spectrum calculated by an analytic signal calculating section 52.

FIG. 5 shows, as an example, the complex spectrum calculated by the analytic signal calculating section 52. The analytic signal calculating section 52 may extract the fundamental frequency component of the signal under measurement from the complex spectrum.

Figure 6:
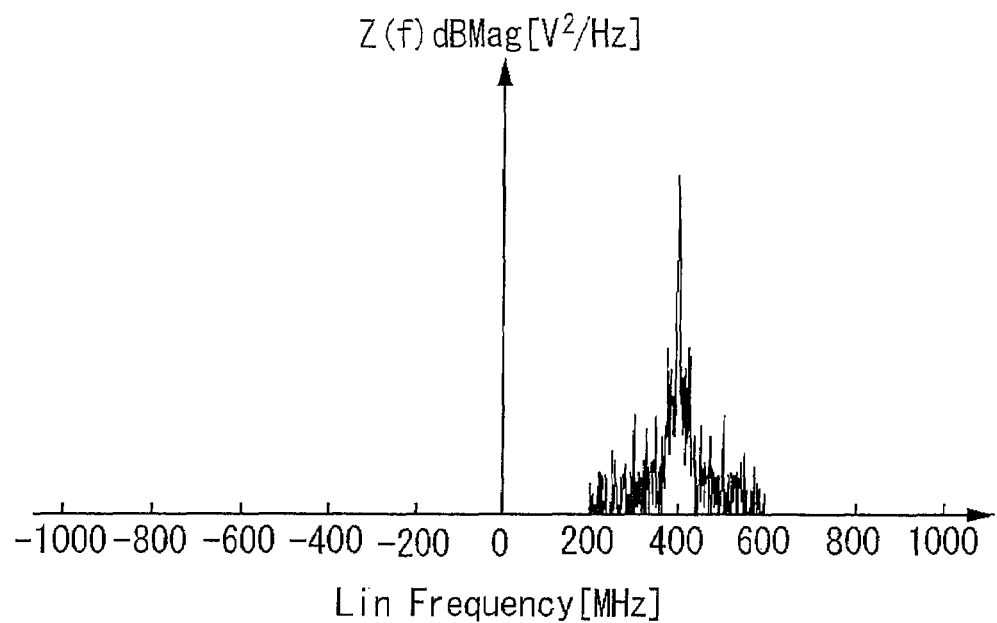
FIG. 6 shows, as an example, a fundamental frequency component extracted by the analytic signal calculating section 52.

FIG. 6 shows, as an example, the fundamental frequency component extracted by the analytic signal calculating section 52. As shown in FIG. 6, the fundamental frequency component of the signal under measurement may be a component of the complex spectrum which corresponds to a predetermined frequency range having the carrier frequency of the signal under measurement in the middle. Here, the width of the frequency range may be substantially equal to the value of the carrier frequency. The analytic signal calculating section 52 may calculate the analytic signal of the signal under measurement by performing inverse Fourier transform on the extracted fundamental frequency component.

Figure 7:
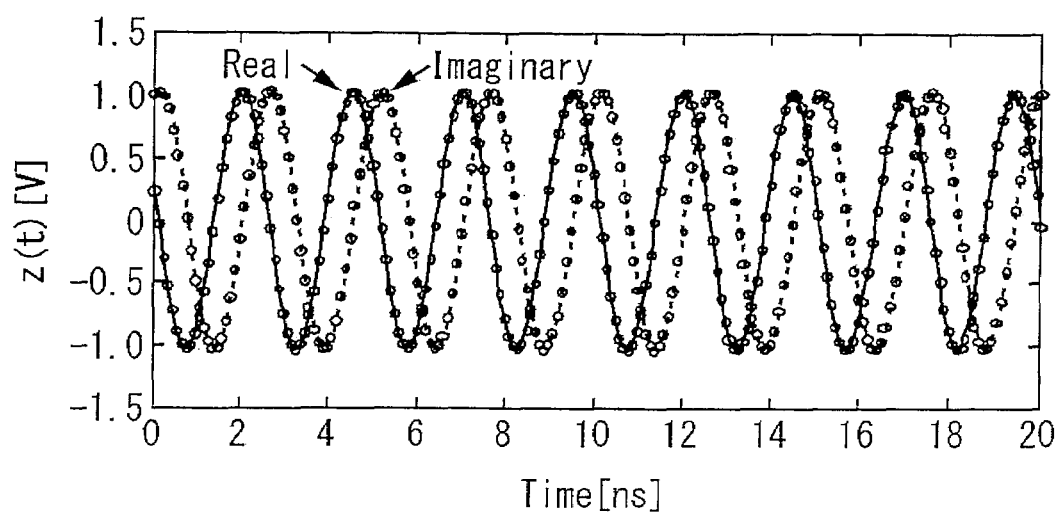
FIG. 7 shows, as an example, an analytic signal calculated by the analytic signal calculating section 52.

FIG. 7 shows, as an example, the analytic signal calculated by the analytic signal calculating section 52. As shown in FIG. 7, the analytic signal may be a signal having the waveform of the signal under measurement as the real part, and the waveform obtained by shifting the phase of the signal under measurement by 90 degrees as the imaginary part. The analytic signal calculating section 52 may calculate the analytic signal by generating a Hilbert transform pair of the signal under measurement.

As a result of the above-described operations, the analytic signal calculating section 52 can calculate the analytic signal of the signal under measurement. Here, the sampling section 30 used to obtain the sampling result shown in FIG. 4 has a resolution of several bits in the amplitude axis. However, the analytic signal calculating section 52 can also generate the analytic signal in a similar manner based on the result of the sampling done by the sampling section 30 which has a resolution of 1 bit.

The instantaneous phase calculating section 54 calculates the instantaneous phase of the signal under measurement based on the analytic signal calculated by the analytic signal calculating section 52. For example, the instantaneous phase calculating section 54 may calculate the instantaneous phase of the signal under measurement by obtaining the arctangent of the real and imaginary parts of the analytic signal.

Here, the function of the instantaneous phase which is calculated based on the arctangent of the real and imaginary parts of the analytic signal is expressed with the range of the principal value from $-\pi$ to $\pi$, for example. In other words, the function of the instantaneous phase is a discontinuous function in which a value $\pi$ is followed by a value $-\pi$. In this case, the analytic signal calculating section 52 may unwrap the instantaneous phase by sequentially adding the value $2\pi$ to the points of discontinuity in the function of the instantaneous phase, for example, thereby calculating a continuous instantaneous phase.

Figure 8:
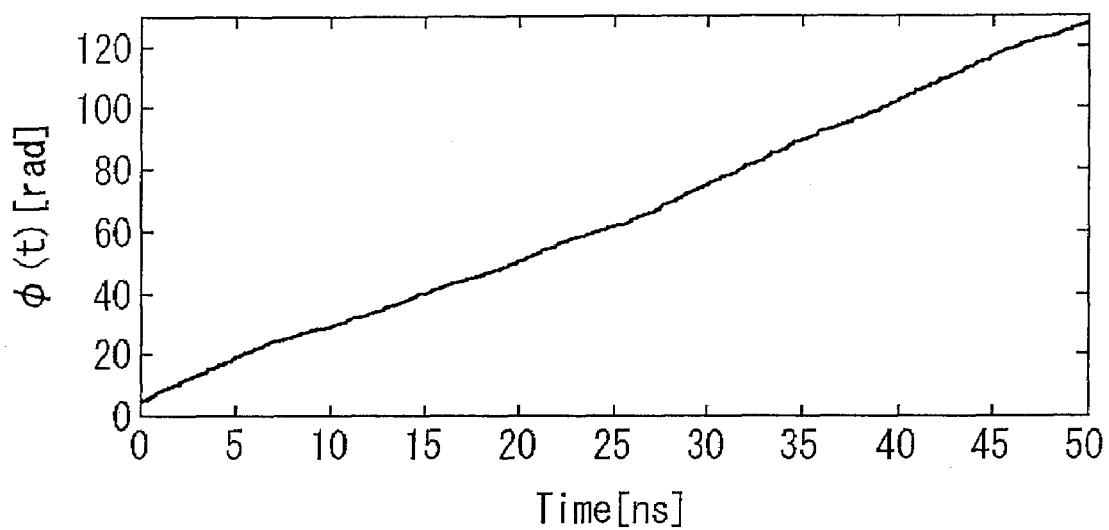
FIG. 8 shows, as an example, the waveform of an unwrapped instantaneous phase.

FIG. 8 shows, as an example, the waveform of the unwrapped instantaneous phase. As shown in FIG. 8, a continuous instantaneous phase can be obtained by means of phase unwrapping.

The initial phase calculating section 56 calculates the initial phase angle of the signal under measurement based on the waveform of the instantaneous phase which is calculated by the instantaneous phase calculating section 54. For example, the initial phase calculating section 56 may calculate such an initial phase ($\phi_0$ that the square error between the waveform data of the instantaneous phase $\phi(k)$ and the straight line $\omega \cdot k + \phi_0$ assumes the minimum value. Specifically speaking, the initial phase calculating section 56 may calculate such an initial phase $\phi_0$ that the following expression takes the minimum value.

$$\sum_{k=1}^{N}(\phi(k)-(\omega \cdot k+\phi_0))^2 \quad \text{Expression 1}$$

Here, the initial phase $\phi_0$ can be expressed by the following expression, for example.

$$\phi_0=\frac{2N(2N+1)\sum_{k=1}^{N}\phi(k)-6\sum_{k=1}^{N}k\phi(k)}{N(N-1)} \quad \text{Expression 2}$$

The above-mentioned estimation of a parameter based on linear line fitting is described, for example, in "Analysis and Measurement Procedure. 2nd ed.", p. 362, J. S. Bendat and A. G. Piersol, John Wiley & Sons, Inc., 1986.

As described above, the phase calculating section 50 can calculate the phase of the signal under measurement by calculating the analytic signal based on the result of the sampling done by the sampling section 30, calculating the instantaneous phase based on the analytic signal, and obtaining the initial value of the instantaneous phase. Here, the instantaneous phase $\phi(k)$ contains an ideal linear line component $\omega \cdot k+\phi_0$ and an instantaneous phase noise component (timing jitter) $\Delta\phi(k)$. Therefore, to accurately calculate the initial phase $\phi_0$ of the signal under measurement based on the sampling result, the measurement resolution of the sampling section 30 is preferably sufficient to achieve a certain level of accuracy for the information which indicates the average value of the instantaneous phase noise $\Delta\phi(k)$ of the signal under measurement and is included in the sampling result.

Figure 9A:
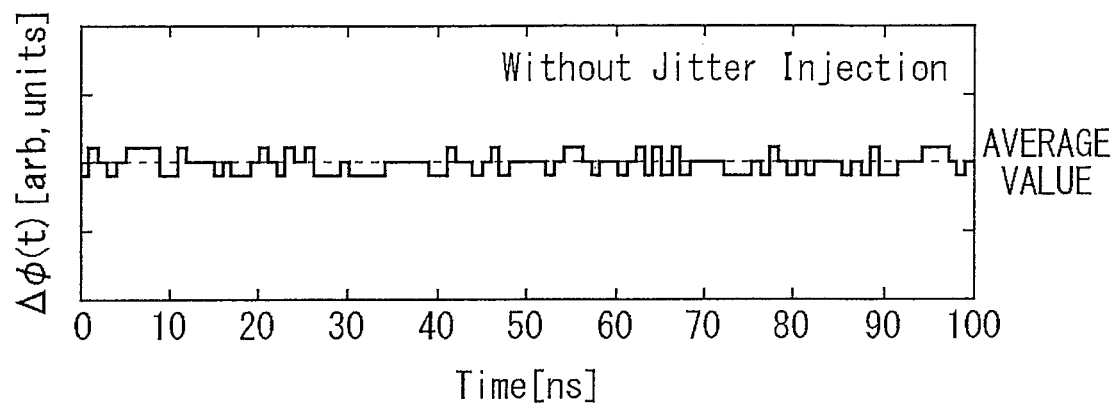
FIG. 9A shows, as an example, the waveform of an instantaneous phase noise Δφ(t) of a signal under measurement to which jitter is not injected by a jitter injecting section 10.
Figure 9B:
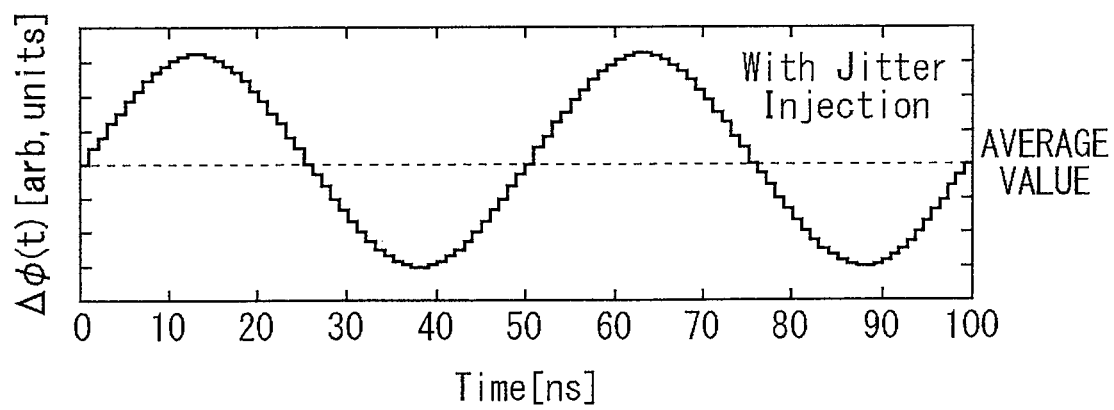
FIG. 9B shows, as an example, the waveform of an instantaneous phase noise Δφ(t) of a signal under measurement to which jitter is injected by the jitter injecting section 10.

FIG. 9A shows, as an example, the waveform of the instantaneous phase noise $\Delta\phi(t)$ of the signal under measurement to which jitter is not injected by the jitter injecting section 10. FIG. 9B shows, as an example, the waveform of the instantaneous phase noise $\Delta\phi(t)$ of the signal under measurement to which jitter is injected by the jitter injecting section 10. Here, the waveforms of the instantaneous phase noise $\Delta\phi(t)$ shown in FIGS. 9A and 9B may be obtained by subtracting a linear line component $\omega \cdot t+\phi_0$ from the instantaneous phase $\phi(t)$ shown in FIG. 8.

Generally speaking, the instantaneous phase noise $\Delta\phi(t)$ included in a signal continuously varies. In the case of digital signal processing, for example, in the phase measurement apparatus 100, however, a sufficient measurement resolution may not be attained to treat the instantaneous phase noise as a continuous parameter. When measurement is conducted under this environment, the calculation of the instantaneous phase noise produces a waveform which discontinuously varies due to a low resolution, as shown in FIG. 9A. This degrades the quality of the information indicating the average value of the instantaneous phase noise, which results in lower accuracy in estimating the initial phase.

Here, the jitter injecting section 10 injects jitter when the phase measurement is conducted in the phase measurement apparatus 100. In this way, the sampling result obtained by the phase measurement apparatus 100 includes information indicating the instantaneous phase noise in a more continuous waveform, as shown in FIG. 9B. The sampling result obtained in this way can accurately keep therein the information indicating the average value of the instantaneous phase noise, similarly to the exemplary case described with reference to FIG. 2. As a result, by using this sampling result to calculate the initial phase $\phi_0$ in the above-described manner, the phase measurement apparatus 100 can obtain an accurate initial phase $\phi_0$.

Furthermore, the phase calculating section 50 may extract a carrier frequency component of the signal under measurement from the complex spectrum shown in FIG. 4, and calculate the phase angle of the carrier frequency component. Here, the phase angle of the carrier frequency component can be obtained based on the arctangent of the real and imaginary parts of the carrier frequency component.

Since the phase of the signal under measurement is greatly dependent on the phase angle of the carrier frequency component, the phase calculating section 50 can also accurately calculate the phase when calculating the phase of the signal under measurement based on the phase angle of the carrier frequency component.

Figure 10:
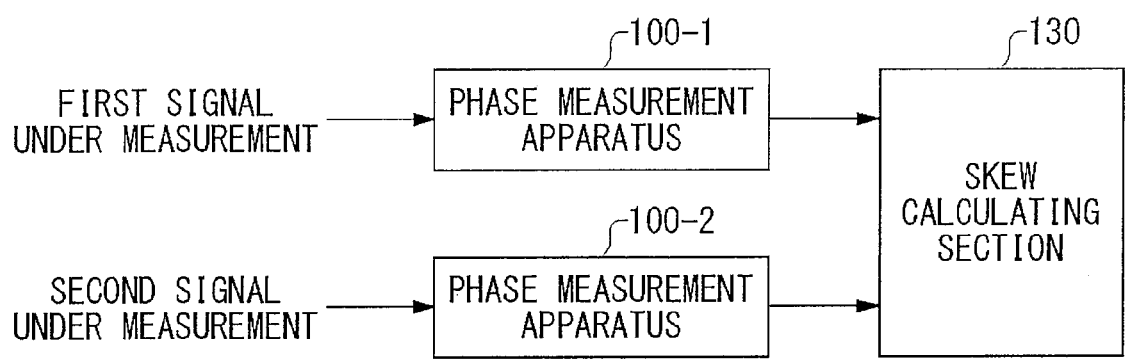
FIG. 10 shows an exemplary configuration of a skew measurement apparatus 200 relating to an embodiment of the present invention.

FIG. 10 shows an exemplary configuration of a skew measurement apparatus 200 relating to an embodiment of the present invention. The skew measurement apparatus 200 is used to measure a skew between first and second signals under measurement which have substantially the same period. The skew measurement apparatus 200 includes therein a first phase measurement apparatus 100-1, a second phase measurement apparatus 100-2, and a skew calculating section 130. The first and second phase measurement apparatuses 100-1 and 100-2 may have the same functions and configuration as the phase measurement apparatus 100 described with reference to FIGS. 1 to 9.

For example, the first phase measurement apparatus 100-1 may include therein a first jitter injecting section 10, a first sampling section 30, and a first phase calculating section 50. The second phase measurement apparatus 100-2 may include therein a second jitter injecting section 10, a second sampling section 30, and a second phase calculating section 50.

The first phase measurement apparatus 100-1 measures the phase of the first signal under measurement. The second phase measurement apparatus 100-2 measure the phase of the second signal under measurement. The first and second phase measurement apparatuses 100-1 and 100-2 may simultaneously measure the phases of the first and second signals under measurement. For example, it is preferable that the first and second phase measurement apparatuses 100-1 and 100-2 simultaneously sample the first and second signals under measurement based on the same sampling clock.

Here, the simultaneous measurement may include, for example, a case where a time interval from when the signal under measurement is output from a transmitter to when the first sample of data is obtained by the sampling section 30 is the same in the first and second phase measurement apparatuses 100-1 and 100-2. It is preferable that the same sampling clock is supplied to the first and second sampling sections 30. Alternatively, the first and second sampling sections 30 may sample the first and second signals under measurement, in synchronization with each other, by using sampling clocks having the same frequency, which have a known timing offset therebetween. In this case, the skew calculating section 130 may correct the measured skew by using the known timing offset.

The skew calculating section 130 calculates a skew between the first and second signals under measurement based on the results of the samplings done by the first and second sampling sections 30. The skew calculating section 130 relating to the present embodiment calculates the skew based on a difference between the initial phase of the first signal under measurement which is calculated by the first phase calculating section 50 based on the result of the sampling done by the first sampling section 30 and the initial phase of the second signal under measurement which is calculated by the second phase calculating section 50 based on the result of the sampling done by the second sampling section 30, for example.

As described earlier with reference to FIGS. 1 to 9, each phase measurement apparatus 100 calculates, as the phase of the signal under measurement, the average value of the positions of the edges of the signal under measurement. Therefore, the skew calculated by the skew calculating section 130 corresponds to a deterministic skew between the signals under measurement. Here, the deterministic skew between the signals under measurement is uniquely determined by the characteristics of the transmission path 110 or the like, and does not include a random (irregular) skew component. The deterministic skew is expressed as a difference between the average values of the positions of the edges of the two signals as explained above.

Figure 11:
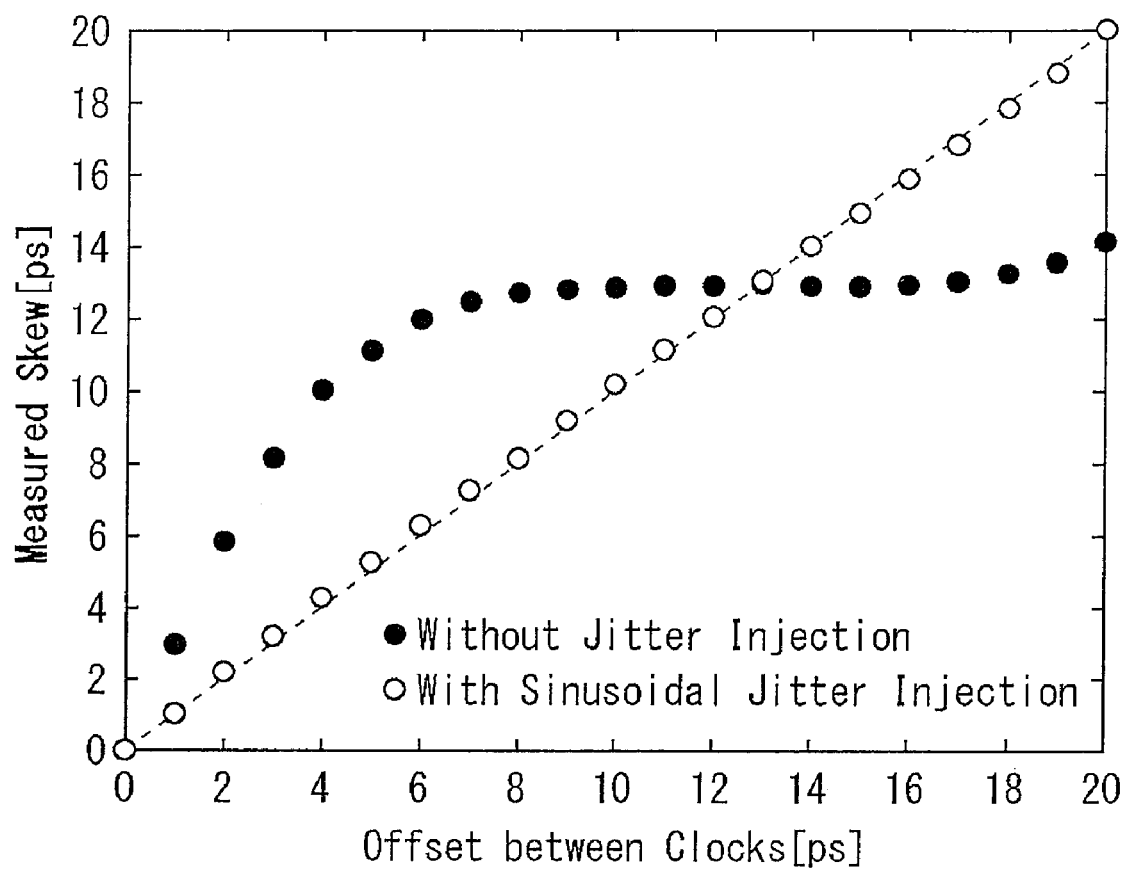
FIG. 11 shows, as an example, skews measured by the skew measurement apparatus 200.

FIG. 11 shows, as an example, the skews measured by the skew measurement apparatus 200. In FIG. 11, the open circles are used to plot the measurement results obtained when the jitter injecting section 10 injects jitter. On the other hand, the filled circles are used to plot the measurement results obtained when the jitter injecting section 10 does not inject jitter. In FIG. 11, the true value of the skew between the signals under measurement is plotted along the horizontal axis, and the measured value of the skew is plotted along the vertical axis.

According to the example shown in FIG. 11, the frequencies of the signals under measurement are set at 1.5 GHz, the frequencies of the sampling clocks are set at 6.48 GHz, and the resolutions of the sampling sections 30 in the amplitude axis are set at 1 bit. In addition, the jitter injecting sections 10 inject, into the signals under measurement, sinusoidal jitter which has an amplitude substantially equal to the unit interval (one period) of the signals under measurement and has a frequency of 1 MHz. Under the above conditions, the skew is measured between the signals under measurement by varying the skew, in units of 1 ps, between 0 ps and 20 ps.

As indicated in FIG. 11, when the jitter is not injected, the measured value stays substantially the same when the true value of the skew falls in a certain range. This is because, even when the skew is varied by shifting the phase of one of the signals under measurement within a certain range, the measurement resolutions in the amplitude and time axes are low and the variation in the skew is thus not detectable as shown in FIG. 2. As is apparent from FIG. 11, the maximum measurement error is approximately 6 ps when the jitter is not injected.

On the other hand, when the jitter injecting sections 10 inject the jitter, the error between the true value represented by the dotted line in FIG. 11 and the obtained measurement result is small. With the jitter injection, the maximum measurement error is approximately 0.3 ps. The above-mentioned experimental results indicate that the injection of the jitter by the jitter injecting sections 10 into the signals under measurement improves the measurement accuracy.

The above description is made under an assumption that the time interval between the corresponding edges of the two signals under measurement is shorter than the period of the signals. The following describes an exemplary operation performed by the skew measurement apparatus 200 when the time interval between the corresponding edges of the two signals under measurement is equal to or longer than the period of the signals.

Figure 12:
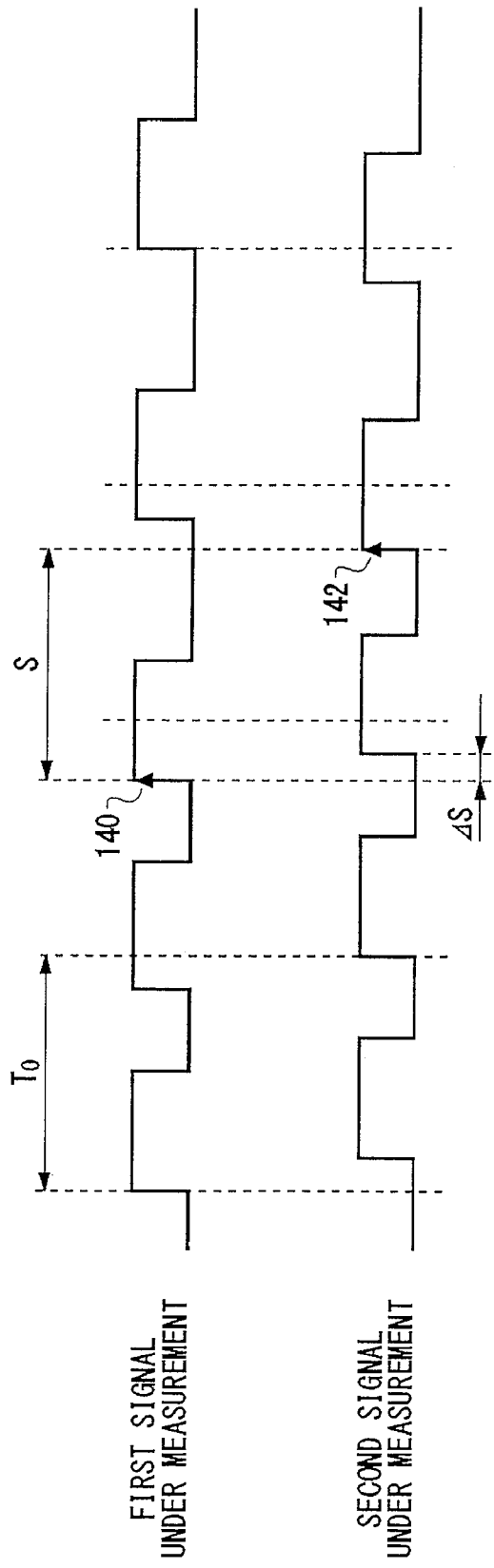
FIG. 12 shows, as an example, two signals under measurement.

FIG. 12 shows, as an example, two signals under measurement. In the example shown in FIG. 12, an edge 140 of a first signal under measurement corresponds to an edge 142 of a second signal under measurement. For example, it is assumed that the edges 140 and 142 are transmitted at the same timing but that the transmission path 110 and the like generate a skew S which is larger than the period $T_0$ of the signals under measurement.

In this case, the skew calculating section 130 is expected to calculate, as the deterministic skew, the mean value of the skew S. However, the skew measurement apparatus 200 described with reference to FIG. 10 calculates, as the deterministic skew, the difference between the mean value of the positions of the edges of the first signal under measurement and the mean value of the positions of the edges of the second signal under measurement. For this reason, the calculated skew is the mean value of the component $\Delta S$, which excludes the component equal to the integral multiple of the period $T_0$ of the signals under measurement and is thus smaller than the period $T_0$.

Figure 13:
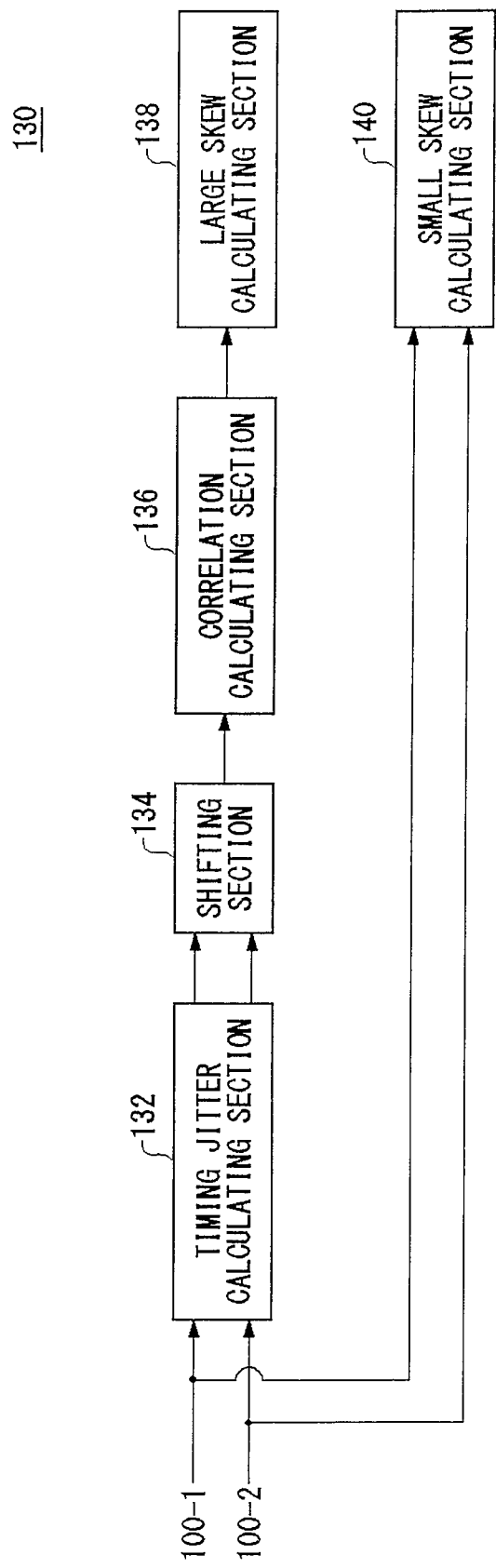
FIG. 13 shows an exemplary configuration of a skew calculating section 130.

FIG. 13 shows an exemplary configuration of the skew calculating section 130. The skew calculating section 130 relating to this example can also calculate a skew which is larger than the period $T_0$ of the signals under measurement, as discussed above. Here, the first and second signals under measurement are generated in synchronization with the same reference signal in this example. The skew calculating section 130 includes therein a timing jitter calculating section 132, a shifting section 134, a correlation calculating section 136, a large skew calculating section 138, and a small skew calculating section 140.

The small skew calculating section 140 calculates the component which is smaller than the period $T_0$ of the signals under measurement, based on the difference between the phases measured by the first and second phase measurement apparatuses 100-1 and 100-2, in a similar manner to the skew calculating section 130 described with reference to FIGS. 10 to 12.

The timing jitter calculating section 132 receives the instantaneous phases $\phi(t)$ calculated by the instantaneous phase calculating sections 54 of the first and second phase measurement apparatuses 100-1 and 100-2. Based on the received instantaneous phases $\phi(t)$, the timing jitter calculating section 132 then calculates timing jitter sequences $\Delta\phi(n)$ of the respective signals under measurement.

For example, the tiling jitter calculating section 132 may calculate instantaneous phase noise $\Delta\phi(t)$ by subtracting, from each of the instantaneous phases $\phi(t)$, a linear line obtained by performing linear line fitting on the corresponding instantaneous phase $\phi(t)$. The timing jitter calculating section 132 may then calculate each of the timing jitter sequences $\Delta\phi(n)$ by sampling the calculated instantaneous phase noise $\Delta\phi(t)$ at the timings of the zero-crossing points of the real part of the corresponding analytic signal.

FIG. 14 shows, as an example, first and second timing jitter sequences of the first and second signals under measurement. Since the first and second signals under measurement are generated in synchronization with the same reference signal in this example, the jitter of the reference signal is similarly injected to both of the first and second signals under measurement. Therefore, the first and second timing jitter sequences $\Delta\phi(n)$ of the first and second signals under measurement have waveforms similar to each other, and have a phase difference corresponding to the skew S therebetween.

The shifting section 134 shown in FIG. 13 sequentially shifts the timing of at least one of the first and second timing jitter sequences by an amount equal to an integral multiple of the period $T_0$ of the first and second signals under measurement. In this example, the shifting section 134 shifts the timing of the second timing jitter sequence $\Delta\phi(n)$ by an amount N (N is an integer), and sequentially varies the value of N.

The correlation calculating section 136 calculates a correlation value between the first and second timing jitter sequences for each shifting amount (or each value of N) of the shifting section 134. For example, the shifting section 134 may calculate a cross correlation function between the first and second timing jitter sequences.

The large skew calculating section 138 detects such a shifting amount that the correlation calculated by the correlation calculating section 136 assumes the maximum value. Based on the detected shifting amount, the large skew calculating section 138 calculates the component $N \cdot T_0$ of the skew between the first and second signals under measurement, which is equal to the integral multiple of the period of the first and second signals under measurement. The large skew calculating section 138 may calculate, as the skew equal to the integral multiple of the period, the shifting amount which causes the correlation to take the maximum value.

By performing the above operations, the skew calculating section 130 can calculate the component $N \cdot T_0$ which is equal to the integral multiple of the period of the first and second signals under measurement and the component $\Delta S$ which is smaller than the period of the first and second signals under measurement, which together constitute the skew between the first and second signals under measurement. The skew calculating section 130 may calculate the total value of the skew S by adding together the value calculated by the large skew calculating section 138 and the value calculated by the small skew calculating section 140.

It should be noted that the same jitter is preferably injected in the first and second phase measurement apparatuses 100-1 and 100-2. However, the present invention is not limited to the injection of the same jitter. When a skew is measured by the skew measurement apparatus 200, the average value of the jitter injected by each jitter injecting section 10 may not need to be zero with the same jitter being injected in the first and second phase measurement apparatuses 100-1 and 100-2.

As is apparent from the above description, the embodiments of the present invention make it possible to measure an accurate phase of a signal under measurement and to measure an accurate skew between two signals under measurement.

While one aspect of the present invention has been described through the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

The invention claimed is:

1. A phase measurement apparatus for measuring a phase of a signal under measurement, comprising:
   a sampling section that samples the signal under measurement at timings given by a sampling clock supplied thereto;
   a jitter injecting section that injects jitter to at least one of the signal under measurement which is to be input into the sampling section and the sampling clock, an amplitude of the jitter, which modulates, in a time axis, the edge of one of the signal under measurement and sampling clock, being larger than a period of the sampling clock; and
   a phase calculating section that calculates the phase of the signal under measurement based on a result of the sampling performed by the sampling section.

2. The phase measurement apparatus as set forth in claim 1, wherein the jitter injecting section injects the jitter which has substantially symmetrical distributions for jitter components for delaying and advancing a phase of an edge of one of the signal under measurement and sampling clock.

3. The phase measurement apparatus as set forth in claim 2, wherein the jitter injecting section injects the jitter which has substantially symmetrical jitter waveforms for the components for delaying and advancing the phase of the edge of one of the signal under measurement and sampling clock.

4. The phase measurement apparatus as set forth in claim 3, wherein the jitter injecting section injects the jitter in which the jitter waveforms of the delaying and advancing components alternate with each other.

5. The phase measurement apparatus as set forth in claim 1, wherein the phase calculating section calculates, as the phase of the signal under measurement, an average value of positions of edges of respective cycles of the signal under measurement.

6. The phase measurement apparatus as set forth in claim 1, wherein the phase calculating section calculates a complex spectrum by performing Fourier transform on the result of the sampling performed by the sampling section, extracts a carrier frequency component of the signal under measurement from the complex spectrum, and calculates a phase angle of the carrier frequency component of the signal under measurement.

7. A phase measurement apparatus for measuring a phase of a signal under measurement, comprising:
   a sampling section that samples the signal under measurement at timings given by a sampling clock supplied thereto:
   a jitter injecting section that injects jitter to at least one of the signal under measurement which is to be input into the sampling section and the sampling clock; and
   a phase calculating section that calculates the phase of the signal under measurement based on a result of the sampling performed by the sampling section,
   wherein the phase calculating section includes:
      an analytic signal calculating section that calculates an analytic signal of the signal under measurement based on the result of the sampling performed by the sampling section;
      an instantaneous phase calculating section that calculates an instantaneous phase of the signal under measurement based on the analytic signal; and
      an initial phase calculating section that calculates an initial phase angle of the signal under measurement based on the instantaneous phase of the signal under measurement.

8. The phase measurement apparatus as set forth in claim 7, wherein the jitter injecting section injects the jitter which has substantially symmetrical distributions for jitter components for delaying and advancing a phase of an edge of one of the signal under measurement and sampling clock.

9. The phase measurement apparatus as set forth in claim 8, wherein the jitter injecting section injects the jitter which has substantially symmetrical jitter waveforms for the components for delaying and advancing the phase of the edge of one of the signal under measurement and sampling clock.

10. The phase measurement apparatus as set forth in claim 9, wherein the jitter injecting section injects the jitter in which the jitter waveforms of the delaying and advancing components alternate with each other.

11. The phase measurement apparatus as set forth in claim 7, wherein the phase calculating section calculates, as the phase of the signal under measurement, an average value of positions of edges of respective cycles of the signal under measurement.

12. The phase measurement apparatus as set forth in claim 7, wherein the phase calculating section calculates a complex spectrum by performing Fourier transform on the result of the sampling performed by the sampling section, extracts a carrier frequency component of the signal under measurement from the complex spectrum, and calculates a phase angle of the carrier frequency component of the signal under measurement.

* * * * *